(12) United States Patent
Yang

(10) Patent No.: US 7,285,488 B2
(45) Date of Patent: Oct. 23, 2007

(54) METHOD OF FABRICATING STRAINED CHANNEL FIELD EFFECT TRANSISTOR PAIR HAVING UNDERLAPPED DUAL LINERS

(75) Inventor: Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/492,455

(22) Filed: Jul. 25, 2006

(65) Prior Publication Data

US 2006/0261480 A1 Nov. 23, 2006

Related U.S. Application Data

(60) Division of application No. 10/904,060, filed on Oct. 21, 2004, now Pat. No. 7,102,233, which is a continuation-in-part of application No. 10/904,059, filed on Oct. 21, 2004, now Pat. No. 7,098,536.

(51) Int. Cl.
*H01L 21/4763* (2006.01)
*H01L 23/52* (2006.01)

(52) U.S. Cl. ..................................... 438/618; 257/751

(58) Field of Classification Search ................ 257/621, 257/622, 750–752; 438/618, 672, 652–657
See application file for complete search history.

(56) References Cited

U.S. PATENT DOCUMENTS

| | | | |
|---|---|---|---|
| 6,211,035 B1 | 4/2001 | Moise et al. ................. | 438/396 |
| 6,599,813 B2 | 7/2003 | Beyer et al. ................. | 438/424 |
| 6,943,398 B2 | 9/2005 | Ito et al. ...................... | 257/310 |
| 2003/0222299 A1 | 12/2003 | Miura .......................... | 257/306 |

*Primary Examiner*—Calvin Lee
(74) *Attorney, Agent, or Firm*—Daryl K. Neff, Esq.; H. Daniel Schnurmann

(57) ABSTRACT

A method is provided of forming contact vias. A dielectric region is formed to overlie substantially all of a transistor structure, the dielectric region having a substantially planar upper surface. A dielectric barrier layer is formed to overlie the upper surface of the dielectric region, the dielectric barrier layer being adapted to substantially prevent diffusion of one or more materials from above the dielectric barrier layer into the dielectric region. A first contact via is formed to extend through the dielectric barrier layer and the dielectric region to provide conductive communication with a conductive member of the transistor structure. A second contact via is formed to extend through the dielectric barrier layer and the dielectric region to provide conductive communication with one of a source region or a drain region of the transistor structure.

15 Claims, 3 Drawing Sheets

METHOD OF FABRICATING STRAINED CHANNEL FIELD EFFECT TRANSISTOR PAIR HAVING UNDERLAPPED DUAL LINERS

CROSS-REFERENCE TO RELATED APPLICATION

This application is a division of U.S. patent application Ser. No. 10/904,060 filed Oct. 21, 2004 and issued as U.S. Pat. No. 7,102,233, which is a continuation-in-part of U.S. patent application Ser. No. 10/904,059 filed Oct. 21, 2004 and issued as U.S. Pat. No. 7,098,536. The disclosures of which are incorporated herein by reference.

BACKGROUND OF THE INVENTION

The present invention relates to semiconductor devices, and more specifically to a method of making a structure having a conductive via to a semiconductor device region.

In fabricating integrated circuits in conventional bulk semiconductor wafers, wells of either P-type or N-type conductivity are implanted in a substrate of the opposite conductivity. However, in complementary metal oxide semiconductor (CMOS) technology, both p-type and n-type wells are utilized. Source/drain regions are formed by implanting diffusion regions of the opposite n-type or p-type conductivity as the wells to form metal-oxide-semiconductor field effect transistors (MOSFETs). Recent theoretical and empirical studies have also demonstrated that carrier mobility in a transistor can be increased when a stress of sufficient magnitude is applied to the conduction channel of a transistor to create a strain therein. An increase in the performance of an n-type field effect transistor (NFET) can be achieved by applying a tensile longitudinal stress to the conduction channel of the NFET. An increase in the performance of a p-type field effect transistor (PFET) can be achieved by applying a compressive longitudinal stress to the conduction channel of the PFET.

A stress-imparting film, also referred to herein as a "stressed" film, can be deposited to cover a semiconductor device region to impart a stress thereto for enhancing the conductivity of a transistor, for example, an NFET or a PFET device. Silicon nitride is one material, among others, which can be deposited in such way that the resulting material layer imparts either a tensile stress or a compressive stress to a layer of a second material with which it is in contact. To improve the conductivity of both an NFET and a PFET, a tensile stress-imparting nitride can be formed to cover an NFET device region and a compressive stress-imparting nitride can be formed to cover a PFET device region.

Silicon nitride and other materials are sometimes used to provide a protective barrier to protect against the diffusion of materials which can degrade the performance of semiconductor devices such as FETs. A barrier is especially needed because one or more metals, e.g., copper, used in wiring at levels above the device can diffuse through an intervening dielectric layer to contaminate devices formed at the semiconductor level. However, the presence of a barrier layer can make the fabrication of a conductive via contacting the device more difficult, particularly when an additional layer, e.g., a stress-imparting nitride, is already present as a layer blanketing the semiconductor device region. This concern is best explained with reference to FIG. 1.

FIG. 1 is a cross-sectional view illustrating use of such barrier layer 108. As shown in FIG. 1, a stressed film 105, such as a silicon nitride layer having an internal stress, is disposed as a layer covering a device provided in a semiconductor device region 100. The stressed film 105 also covers features, such as polysilicon conductors (PCs) 150, which are disposed over the semiconductor device region. A barrier layer 108 is deposited to overlie the stressed film. This structure makes it difficult to etch the contact holes that are necessary to form conductive vias to contact the semiconductor device region 100. One contact hole is to be etched along the dotted line 130 to provide a conductive via to the semiconductor device region 100 at a location disposed between respective features such as the PCs 150. Another contact hole is to be etched simultaneously at another location 112, so as to provide a conductive via contacting the PC 150. However, it is difficult to adequately perform and control the simultaneous etching of both contact holes because the thickness of the material making up the stressed film and the barrier layer at the two locations is different. Namely, the combined thickness 120 of the two layers 108, 105 is much greater at location 130 where the contact via is to extend to the semiconductor device region 100 than the thickness 110 of the two layers at location 112 where the contact via to the PC 150 is to be formed. Consequently, problems can result from such etching, such as excessive overetching into the PC 150 at the location 112 where the stressed film and the barrier layer are thinner. Alternatively, the contact hole may not be adequately etched through the stressed film and the barrier layer at location 130, causing the final contact via to show excessive resistance.

Consequently, a need exists for a structure and method of fabricating a semiconductor device in which a protective barrier layer is provided, while permitting contact vias to be etched with less difficulty.

SUMMARY OF THE INVENTION

In accordance with an aspect of the invention, a method is provided of forming contact vias. A dielectric region is formed to overlie substantially all of a transistor structure, the dielectric region having a substantially planar upper surface and the transistor structure including: (a) a semiconductor device region having a channel region and source and drain regions flanking the channel region, and (b) a current conducting member overlying the channel region. A dielectric barrier layer is formed to overlie the upper surface of the dielectric region, the dielectric barrier layer being adapted to substantially prevent diffusion of one or more materials from above the dielectric barrier layer into the dielectric region. A first contact via is formed to extend through the dielectric barrier layer and the dielectric region to provide conductive communication with the member. A second contact via is formed to extend through the dielectric barrier layer and the dielectric region to provide conductive communication with one of the source region or the drain region.

DETAILED DESCRIPTION

Figure 2:
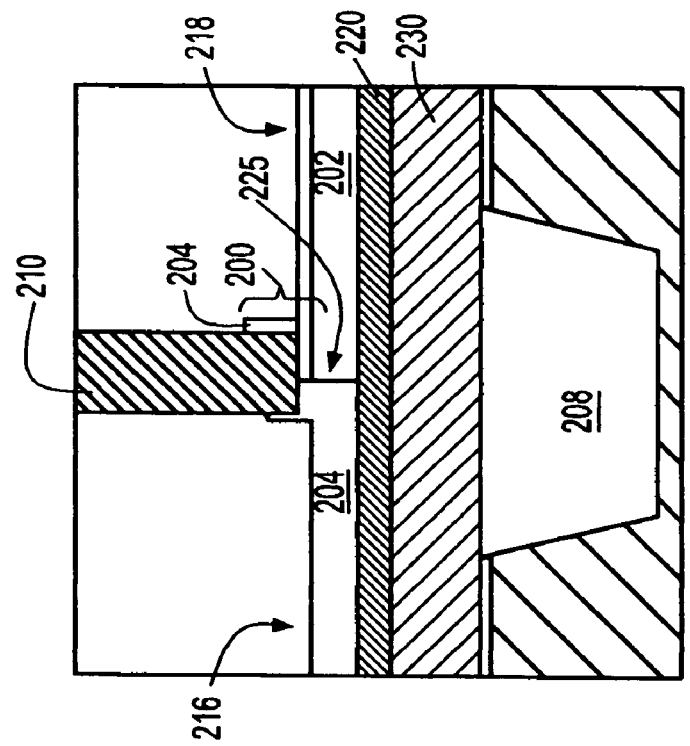
FIG. 2 is a cross-sectional view illustrating another problem of etching a contact via when multiple films, e.g., overlapped nitride films, are present, such as at another location of the structure illustrated in FIG. 1.

As discussed above, CMOS circuits are known which include films that impart a stress to the conduction channel of the transistors therein. It is highly beneficial to have stressed dielectric films, e.g., nitride films, provided as overlayer films to impart compressive and tensile stresses to the conduction channels of PFET and NFET transistors. From a fabrication point of view, such a goal can be accomplished by applying two different overlayer films, each having a different internal stress. FIG. 2 illustrates a structure including a PFET 216 and an NFET 218, as separated by a shallow trench isolation (STI) region 208. Referring to FIG. 2, one stressed film 202 is deposited and patterned to cover the NFET, after which a second stressed film 204 is deposited and patterned to cover the PFET, to produce an overlapped boundary 200, as illustrated in FIG. 2. When the stressed films include a material such as a nitride, which also functions as a barrier, the overlapped boundary 200 between the two films functions to preserve the barrier function where the two separately patterned films meet.

An overlapped boundary, however, can create certain problems. The overlapping of the two films increases the difficulty of forming a contact via 210 at the boundary 200, increasing the likelihood of the etching failing to sufficiently form a contact hole to a silicide 220 or polysilicon portion 230 of a conductor. As a result, contact open failure can result, as illustrated at 225 in FIG. 2. It is, therefore, desired to have the two films underlapped, so as to provide a gap between them, in accordance with an embodiment of the invention.

However, in order to provide an underlapped structure, the above-described contaminant diffusion concerns must be addressed. In such case, there is a concern that a metal or other material in subsequently formed wiring, especially back end of the line (BEOL) structures, may diffuse through the gap to create performance problems. A barrier can be introduced to block the path of the contaminants. However, the barrier needs to have neutral stress so as to avoid having a degrading effect on either the NFET or the PFET. In addition, if the barrier is applied directly in certain locations where one of the stressed films is already provided, the barrier could contribute to contact etch problems, as described above with reference to FIG. 1. One potential way of addressing this problem is to reduce the thickness of each stressed film and the barrier. However, that itself could reduce the benefits of the stressed films and of the barrier. One solution provided by the invention is to place the barrier in a location disposed above the stressed film so that it will behave reliably as a barrier, but does not occupy the same general space as the stressed film. Such solution will now be described with reference to FIGS. 3 through 5.

Figure 3:
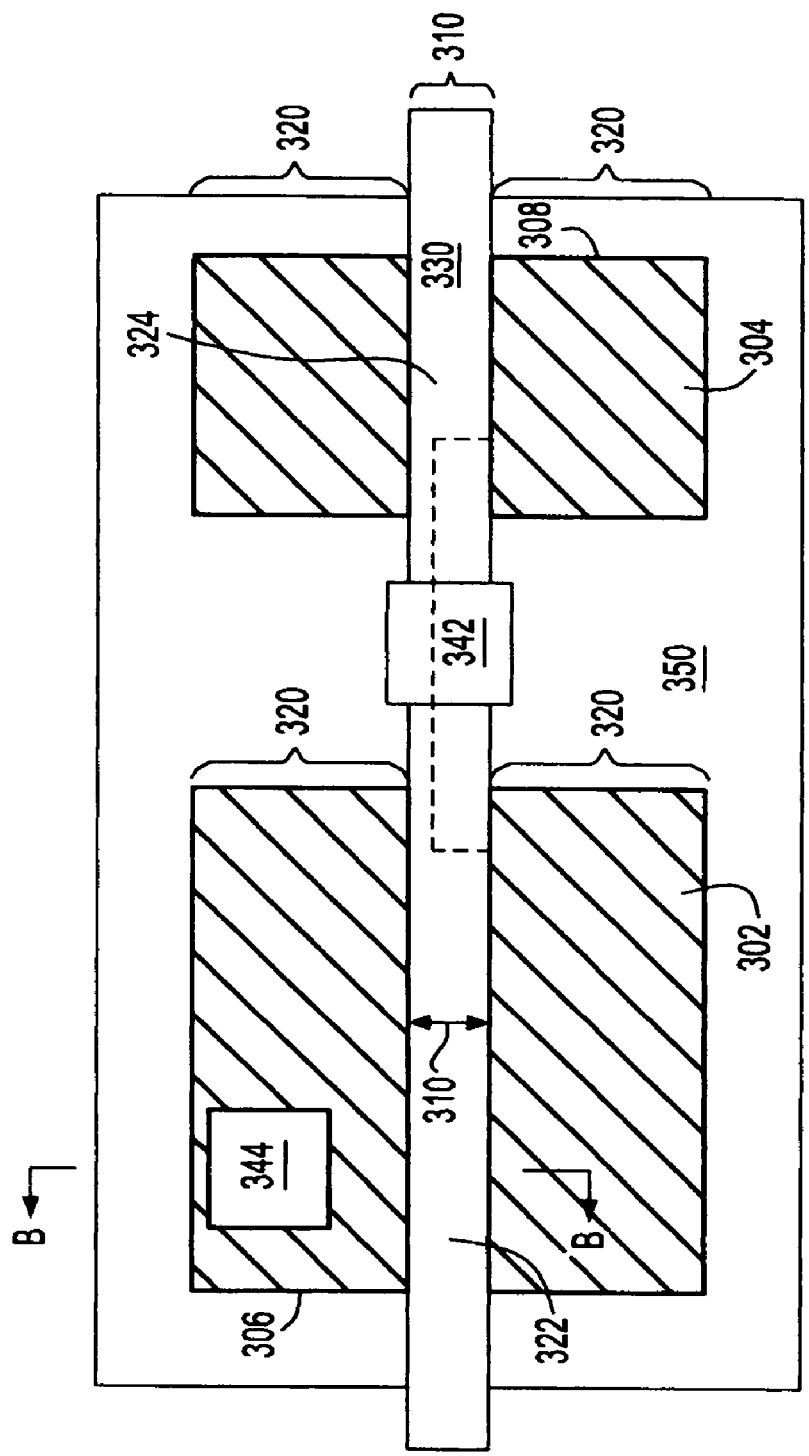
FIG. 3 is a top-down view illustrating one embodiment of the present invention.

FIG. 3 provides a top down illustration of one embodiment of the present invention. As illustrated in FIG. 3, semiconductor device regions 302, 304 are provided in a semiconductor substrate. In the embodiment of FIG. 3, the semiconductor device regions 302, 304 are isolated by a shallow trench isolation 350, which surrounds them. The device regions 302, 304 are processed to form a p-type field effect transistor (PFET) in region 302 and an n-type field effect transistor (NFET) in region 304.

The semiconductor regions 302, 304, in which the PFET and NFET are fabricated, can consist of a single-crystal semiconductor region of a substrate or wafer, the wafer being either a bulk substrate or a semiconductor-on-insulator substrate. For example, in a silicon-on-insulator (SOI) substrate, a relatively thin single-crystal region of a semiconductor is disposed as a device region over an insulating layer. When field effect transistors (FETs) are formed in such SOI substrates, faster switching operation is often achieved than otherwise, because junction capacitance between the channel region of the transistor and the bulk substrate is eliminated.

A conducting member 330, which includes portions functioning as the gate conductors 322 and 324 of the PFET and the NFET, respectively, extends over a first portion 310 of each semiconductor device region 302, 304 and over the STI region 350 between them. This conducting member provides a current conducting member extending from an outer end 306 of the PFET device region 302 to the outer end 308 of the NFET device region 304. The conducting member 330 also maintains the gate conductors 322, 324 at a common potential for both NFET and PFET. The current conducting member may be either comprised of a single layer or multiple layers. For example, in one embodiment of the present invention, the conducting member includes a polycrystalline semiconductor layer. In such case, the conducting member is referred to as "polyconductor" (PC). However, in an alternative embodiment, the current conducting member is comprised of a layer of silicide disposed over the polycrystalline semiconductor layer. The details of such multilayer current conducting member cannot be illustrated adequately in FIG. 3, but are described below.

Polysilicon is a preferred material used in the fabrication of the conducting member 330 as a "polyconductor" to provide workfunction matching as the transistor gates for both the PFET and NFET. Locations of the device regions 302, 304 not traversed by the conducting member 330 are utilized as source/drain regions 320 of the transistors, such regions 320 appropriately doped and processed for the respective transistor types.

As also illustrated in FIG. 3, a contact via 342 is provided in conductive communication with the conducting member 330. A separate contact via to the source region of the PFET, for example, is illustrated at 344. While only one such contact via to the source of the PFET is illustrated in FIG. 3 for ease of reference, similar contacts are provided to both the source and drain regions of both the PFET and NFET. Such contact vias are made by forming contact holes at the respective locations and subsequently filling them to create the device contacts 342 and 344.

Figure 4:
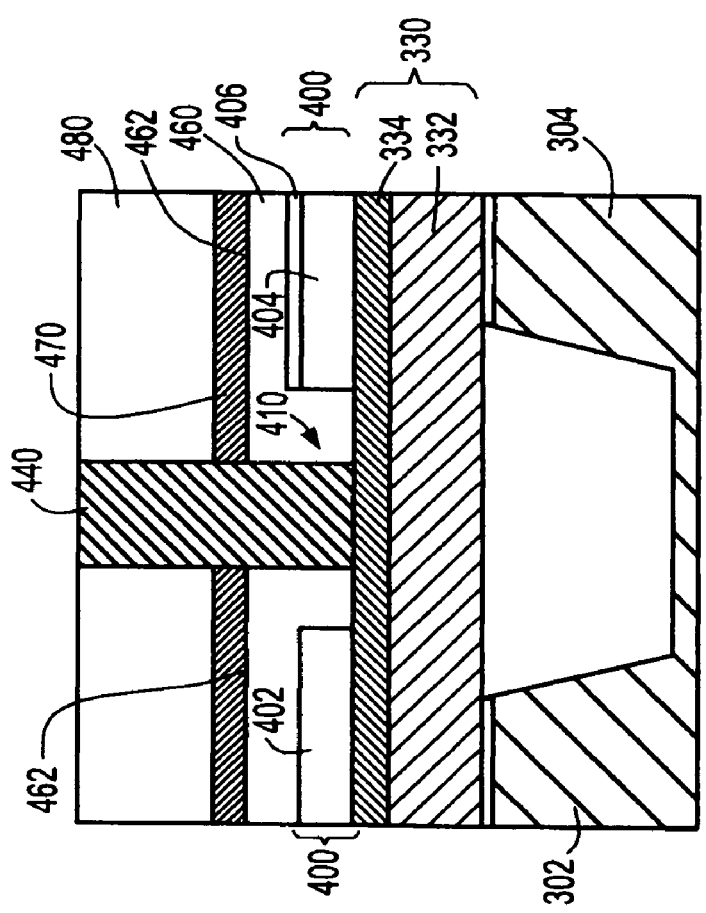
FIG. 4 is a cross-sectional view, through line A-A, of the embodiment of the invention shown in FIG. 3.

FIG. 4 is a cross-sectional view, through line A-A, of the embodiment shown in FIG. 3. FIG. 4 illustrates more clearly a multi-layered current conducting member 330 that includes a first layer 332 including a material such as doped polysilicon and a second layer 334 including a silicide.

A first stress-imparting film 404 extends over the NFET device region 304, as illustrated in FIG. 4. The film 404 is formed in such way to impart a tensile stress to the semiconductor material disposed in a channel region of the NFET in device region 304 below the conducting member 330. Such stressed film 404 enhances the performance of the NFET that it overlays. A preferred example of such a film that can be used is a silicon nitride film ($Si_3N_4$). Another compressive stressed film 402 is provided to impart a compressive stress to the PFET device region 302 that it overlays. In one embodiment, an oxide layer 406 remains disposed over the tensile stressed film 404 in the structure shown. A gap 410 is provided between the two films 402 and 404. These stressed films are deposited and patterned in a manner similar to that described above with respect to FIG. 2.

Once the stressed films 402 and 404 are deposited and patterned as shown, a first dielectric region 460 is formed over the structure, such dielectric region including a material such as is commonly provided as an interlevel dielectric material. At best, the dielectric material is self-planarizing, such that an upper surface 462 of the dielectric region 460 presents a substantially planar surface upon deposition. For example, a highly flowable oxide such as a doped silicate glass, e.g., borophosphosilicate glass (BPSG), borosilicate glass (BSG) or other silicate glass, e.g., undoped silicate glass (USG), serves such purpose. Alternatively, a spin-on-glass (SOG) material can be deposited and heat-treated to provide a relatively planar upper surface. An oxide deposited from a tetraethylorthosilicate (TEOS) precursor can also be used to achieve relative planarity. Alternatively, or in addition thereto, specific steps can be performed after deposition to assist in planarizing the dielectric region 460. For example, chemical mechanical polishing (CMP) can be used to polish down the deposited dielectric region 460 until the upper surface 462 becomes substantially planar.

Thereafter, a barrier layer 470 is provided overlying the substantially planar upper surface 462 of the first dielectric region 460 as illustrated. In one embodiment of the invention, the barrier layer 470 consists of a nitride, such as silicon nitride, which serves to prevent the diffusion of contaminants, such as copper that may be used in BEOL wiring, to locations below the layer 470. Thus, the barrier layer 470 prevents the diffusion of such contaminants into the semiconductor device regions 302 and 304 below. The barrier layer may also serve as an etch-distinguishable layer during etching, to help assure etch uniformity across the wafer, as described below.

In addition, in one embodiment of the present invention, a second dielectric region 480 is formed to overlie the layer 470 to increase the thickness of an interlevel dielectric region made up by regions 460, 470 and 480. This second region 480 is formed, such as by blanket disposition of a dielectric material, e.g. an oxide, over the etch-distinguishable layer 470. The thickness of the first dielectric region is preferably in the range of 1000 to 2000 Å (angstroms). In addition, the thickness of the barrier layer 470 is preferably between 100 and 500 Å. The thickness of the second dielectric layer is preferably between 3000 and 5000 Å.

After formation of the dielectric regions 460, 480 and intervening layer 470, contact vias are formed to provide conductive device contacts. The contact vias are formed by etching through the dielectric regions 480, 460 and the intervening barrier layer 470. It should be noted, that while a plurality of such contact vias 440 can be created to contact the conducting member 330, for ease of illustration, only one such via is illustrated in FIG. 4. In a particular embodiment, the barrier layer functions as an etch-distinguishable layer to increase the uniformity of the etch process, especially when an additional dielectric region 480 is provided above the barrier layer, as shown in FIG. 4. In such case, etching of the dielectric region 480 is conducted selectively to the material of the barrier layer 470, the etching being endpointed when the barrier layer 470 is reached at locations throughout the wafer. Thereafter, the etch process can be adjusted to etch through the barrier layer 470, after which the lower dielectric region 460 is etched. Due to the lower dielectric region 460 having a relatively small thickness compared to the total combined thicknesses of the dielectric regions 460, 480 and the barrier layer 470, it can be etched more uniformly at locations throughout the wafer.

Figure 5:
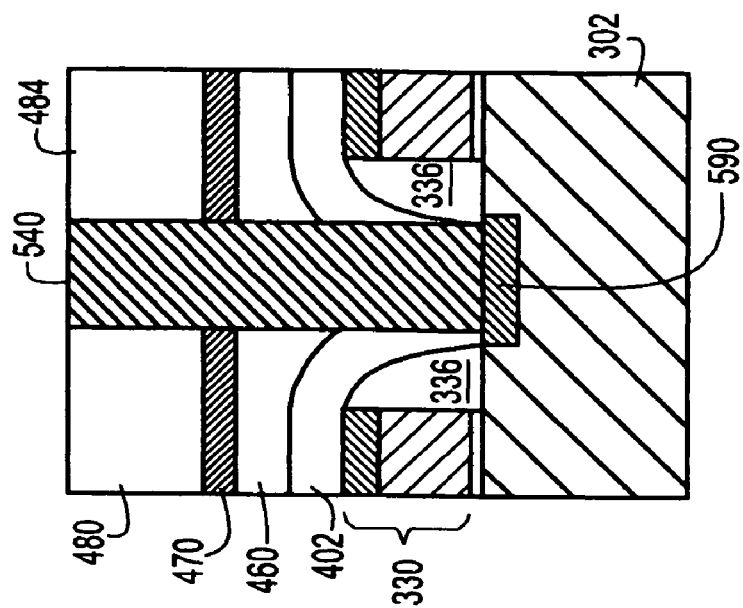
FIG. 5 is a cross-sectional view of an embodiment of the invention, similar to the embodiment shown in FIG. 3.

FIG. 5 illustrates a second contact via 540 used to provide a conductive device contact to a semiconductor device region 302. For example, the contact via 540 can form a conductive contact to a source region of a PFET device region at a location such as that shown at 344 in FIG. 3. This contact via is formed by etching a contact hole through the dielectric regions 480, 460, the intervening barrier layer 470, and the stressed film 402 to reach the semiconductor device region 302. Preferably, a silicide-containing region 590 is then formed on the semiconductor device region 302 from within the contact hole, after which one or more depositions are conducted to fill the contact hole with a metal to form the contact via. Here, the topography of the underlying device structure appears different from that at which the contact via 440 is provided. In FIG. 5, the conductive member 330 is shown in a direction in a sectional view which cuts across the width of the conductive member in a direction like that of cut B-B of FIG. 3. FIG. 5 represents a view most nearly like that shown in FIG. 1.

Illustratively, the silicide-containing region 590 is formed by depositing a silicide precursor metal in the contact hole, e.g., titanium, cobalt, nickel, tungsten, and/or any of many other available precursor metals, and thereafter heating the substrate to react the semiconductor material of the device region 302 with the metal to form a silicide. In such way, the silicide-containing region 590 is formed in a self-aligned manner to the contact via 540. Depending upon the metal used as the silicide precursor, a subsequent step to remove remaining unreacted deposited metal can either be performed prior to filling the contact hole with a final metal, or be postponed until after the contact hole has been filled, in which case, only metal remaining on the outer surface 484 of the dielectric region 480 will be removed.

The contact via 540 is provided in a location disposed between respective conducting members 330. In addition, dielectric spacers 336 may be present, which tends to cause the thickness of the stressed film 402 at that location to be somewhat thicker than that which exists elsewhere. For instance, at the location where contact via 440 (FIG. 4) is provided, no stressed film of any type is present.

Figure 1:
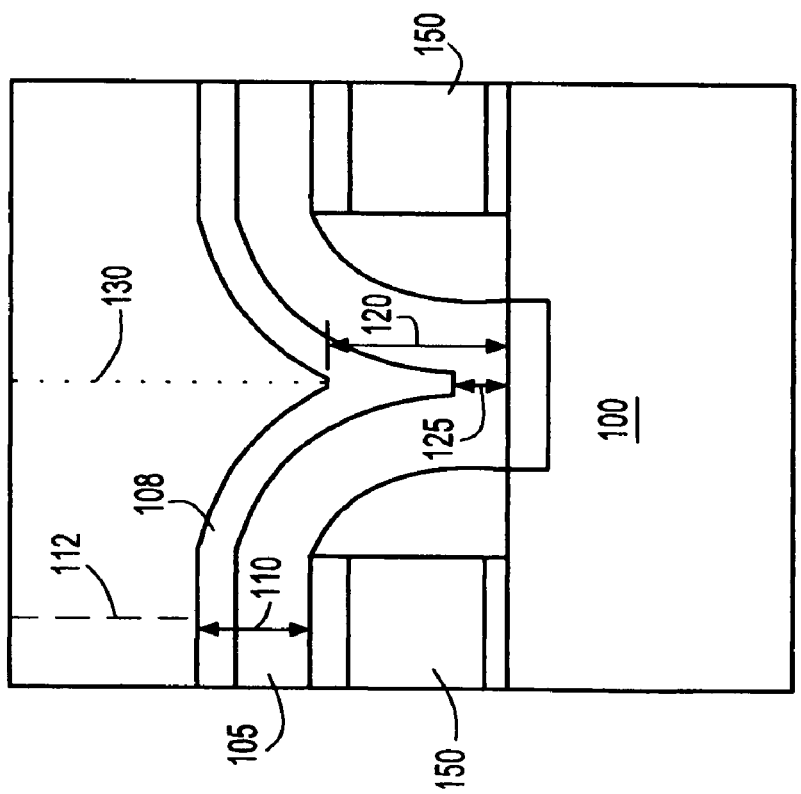
FIG. 1 is a cross-sectional view illustrating a problem of etching a contact via when multiple films, e.g. a stressed film and a barrier layer, are present.

As further shown in FIG. 5, a reduction is achieved in the thickness of the nitride film 402 overlying the device region 302 at the location of the contact via 540, which thickness is similar to that shown at 125 in FIG. 1. This is a reduced thickness in comparison to the combined thickness 120 of the two films 105, 108, if the barrier film 108 were disposed directly on the stressed film 105, as illustrated in FIG. 1. As a result of the reduced film thickness at the location of contact via 440, the difficulty is reduced for simultaneously etching contact holes of the contact vias 440 and 540.

In a particular embodiment, the contact vias 440 and 540 are etched by a process, which is performed, first to etch dielectric region 480, in a manner performed selectively to the material of the barrier layer 470. Since that layer 470 is etch-distinguishable from the material of the upper portion 480 of the interlevel dielectric region, the etch process can be endpointed when the surface of the barrier layer 470 is exposed. Thereafter, the barrier layer 470 is etched, after which the etching process is continued to etch the remaining portion 460 of the interlevel dielectric region. Finally, etching is continued to extend the contact hole through the stressed film 402, the contact hole being generally coextensive with the location of the later-filled contact via 540.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. A method of forming contact vias, comprising:
   forming a dielectric region having a substantially planar upper surface, the dielectric region overlying substantially all of a transistor structure, the transistor structure including: (a) a semiconductor device region having a channel region and source and drain regions flanking the channel region, and (b) a current conducting member overlying the channel region;
   forming a dielectric barrier layer overlying the upper surface of the dielectric region, the dielectric barrier layer adapted to substantially prevent diffusion of one or more materials from above the dielectric barrier layer into the dielectric region;
   forming a first contact via extending through the dielectric barrier layer and the dielectric region to provide conductive communication with the member; and
   forming a second contact via extending through the dielectric barrier layer and the dielectric region to provide conductive communication with one of the source region or the drain region.

2. The method as claimed in claim 1, wherein the member includes a contact portion, the first contact via contacting the contact portion, the method further comprising forming a stressed film prior to forming the dielectric region, the stressed film overlying at least portions of the source region and the drain region and not overlying the contact portion of the member, and the second contact via extends through the stressed film to contact the one of the source region or the drain region.

3. The method as claimed in claim 2, wherein the stressed film consists essentially of a nitride.

4. The method as claimed in claim 2, wherein the stressed film imparts a stress to the channel region of the transistor structure.

5. The method as claimed in claim 4, wherein the stressed film is a first stressed film and the dielectric region overlies a second transistor structure having a second channel region and a second source region and second drain region flanking the second channel region, wherein the member extends horizontally over the second channel region but not over the second source and second drain regions, the dielectric barrier layer and the dielectric region further overlying substantially all of an area occupied by the second transistor, the structure further comprising a second stressed film extending over at least portions of the second transistor structure and not extending over the contact portion of the member.

6. The method as claimed in claim 5, wherein the first transistor structure includes a field effect transistor having a p-type conduction channel ("PFET") and the second transistor includes a field effect transistor having an n-type conduction channel ("NFET"), wherein the member includes gate conductors of the PFET and NFET.

7. The method as claimed in claim 6, wherein the first stressed film has a compressive internal stress such that the first stressed film imparts a compressive stress to the channel region of the PFET of the first transistor structure.

8. The method as claimed in claim 7, wherein the second stressed film has a tensile internal stress such that the second film imparts a tensile stress to the channel region of the NFET of the second transistor structure.

9. The method as claimed in claim 1, wherein the member includes a polycrystalline semiconductor.

10. The method as claimed in claim 1, wherein the dielectric barrier layer consists essentially of a nitride.

11. The method as claimed in claim 1, wherein the thickness of the dielectric barrier layer ranges between about 100 angstroms and 1500 angstroms.

12. The method as claimed in claim 1, further comprising forming a feature including a diffusible material above the dielectric barrier layer, the dielectric barrier layer functioning to substantially prevent the diffusible material from diffusing into the semiconductor device region.

13. The method as claimed in claim 12, wherein the diffusible material includes copper.

14. The method as claimed in claim 13, further comprising forming a second dielectric region overlying the dielectric barrier layer prior to forming the feature overlying the second dielectric region, wherein at least one of the first and second contact vias extends through the second dielectric region.

15. A fabrication method, comprising:
   forming a semiconductor device region having a first portion including a channel region of a p-type field effect transistor ("PFET"), and a second portion including source and drain regions of the PFET, a third portion including channel region of an n-type field effect transistor ("NFET"), and a fourth portion including source and drain regions of the NFET;
   forming a current conducting member extending horizontally over the first and third portions, the member not extending over the second and fourth portions, the member functioning as a gate conductor of the PFET and as a gate conductor of the NFET;
   forming a first stressed film overlying at least the second portion, the stressed film imparting a compressive stress to the channel region of the PFET;
   forming a second stressed film overlying at least the fourth portion, the stressed film imparting a tensile stress to the channel region of the NFET;
   forming a dielectric region overlying the member and overlying substantially all of an area occupied by the PFET and the NFET, the dielectric region having a substantially planar upper surface;
   forming a dielectric barrier layer overlying the substantially planar upper surface of the dielectric region, the dielectric barrier layer overlying substantially all of the area occupied by the PFET and NFET, the dielectric barrier layer being adapted to substantially prevent diffusion of one or more materials from above the dielectric barrier layer into the dielectric region;
   forming a first contact via extending through the dielectric barrier layer, the dielectric region, and the first stressed film to provide conductive communication with the second portion of the semiconductor device region;
   forming a second contact via extending through the dielectric barrier layer, the dielectric region, and the second stressed film to provide conductive communication with the fourth portion of the semiconductor device region; and
   forming a third contact via extending through the dielectric barrier layer and the dielectric region to provide conductive communication with the member.

* * * * *